United States Patent
Koops et al.

(10) Patent No.: US 8,830,020 B2
(45) Date of Patent: Sep. 9, 2014

(54) ACTUATOR, LITHOGRAPHIC APPARATUS, AND ACTUATOR CONSTRUCTING METHOD

(75) Inventors: Rody Koops, Eindhoven (NL); Petrus Mathijs Henricus Vosters, Bladel (NL); Franciscus Stadhouders, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 635 days.

(21) Appl. No.: 12/880,849

(22) Filed: Sep. 13, 2010

(65) Prior Publication Data

US 2011/0063063 A1    Mar. 17, 2011

Related U.S. Application Data

(60) Provisional application No. 61/242,967, filed on Sep. 16, 2009.

(51) Int. Cl.
  *H01F 5/00*    (2006.01)
  *G03F 7/20*    (2006.01)
  *H01F 7/127*   (2006.01)

(52) U.S. Cl.
  CPC ............ *H01F 7/127* (2013.01); *G03F 7/70758* (2013.01)
  USPC ............................................. 335/300; 336/61

(58) Field of Classification Search
  USPC .......................... 335/300; 355/72, 75; 336/61
  See application file for complete search history.

(56) References Cited

U.S. PATENT DOCUMENTS

| | | | |
|---|---|---|---|
| 7,079,226 B2 | 7/2006 | Vreugdewater et al. | |
| 7,088,428 B2 | 8/2006 | Hol et al. | |
| 2004/0218166 A1 | 11/2004 | Vreugdewater et al. | |
| 2004/0218167 A1 | 11/2004 | Hol et al. | |
| 2005/0248219 A1* | 11/2005 | Korenaga | 310/12 |

FOREIGN PATENT DOCUMENTS

| | | |
|---|---|---|
| JP | 2002-010618 | 1/2002 |
| KR | 2004-0081334 | 9/2004 |
| KR | 10-0632885 | 10/2006 |

OTHER PUBLICATIONS

Korean Office Action mailed Feb. 14, 2012 in corresponding Korean Patent Application No. 10-2010-0088362.
Japanese Office Action mailed Oct. 16, 2012 in corresponding Japanese Patent Application No. 2010-198718.

* cited by examiner

*Primary Examiner* — Ramon Barrera
(74) *Attorney, Agent, or Firm* — Pillsbury Winthrop Shaw Pittman LLP

(57) ABSTRACT

An actuator includes a coil; a cooling body configured to cool the coil; a quantity of heat transfer material fixedly arranged between the cooling body and the coil, and a mechanical attacher configured to attach the coil to the cooling body.

15 Claims, 3 Drawing Sheets

ACTUATOR, LITHOGRAPHIC APPARATUS, AND ACTUATOR CONSTRUCTING METHOD

CROSS REFERENCE TO RELATED APPLICATIONS

This application claims priority and benefit under 35 U.S.C. §119(e) to U.S. Provisional Patent Application No. 61/242,967, entitled "Actuator, Lithographic Apparatus, and Actuator Constructing Method", filed on Sep. 16, 2009. The content of that application is incorporated herein in its entirety by reference.

FIELD

The present invention relates to an actuator, a lithographic apparatus including such an actuator, and a method for constructing such an actuator.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus includes in general multiple actuators, for instance to position a patterning device (e.g. a mask) and/or substrate support structure. These actuators may use the interaction between magnetic fields, e.g. produced by permanent magnets, and current-carrying conductors, in particular in the form of a coil, to apply forces to objects. Such actuators may be of a rotary, linear, or planar type and may have a moving coil or moving magnet configuration.

In the abovementioned actuators, the current-carrying conductors, i.e. the coil, may exhibit some kind of electrical resistance, so that a current running through the coil will generate a certain amount of heat. This effect gets even worse when the generated heat also causes an increase in electrical resistance of the coil, thereby further increasing the amount of generated heat, which in turn causes a further increase in electrical resistance of the coil, etc. Eventually this may lead to failure of the coils. The generated heat may also negatively influence the position accuracy of an object, e.g. a mask or substrate support structure, positioned by the actuator. Therefore, the coil is cooled, preferably to a constant temperature.

Cooling can be provided by a cooling body. This cooling body is preferably attached to an object or frame to dump the heat from the coil. A layer of well-known potting material is arranged between the cooling body and the coil to electrically isolate the coil from the cooling body, to transfer forces from the coil to the cooling body, and to transfer heat from the coil to the cooling body.

Thermal expansion differences may exist between the coil and the cooling body due to temperature differences between the coil and the cooling body and/or differences in thermal expansion properties of respective materials. Due to the difference in thermal expansion, stresses occur in the layer of potting material between the coil and cooling body. The maximum allowable stress in the layer of potting material limits the allowable heat generation. As the heat is generated by the current running through the coil, and the magnitude of the current determines the force the actuator applies to an object, the maximum allowable stress in the layer of potting material limits the maximum performance of the actuator in terms of maximum force.

SUMMARY

It is desirable to provide an improved actuator, in particular an actuator with increased maximal performance in terms of maximal allowable force.

According to an embodiment of the invention, there is provided an actuator including:
  a coil;
  a cooling body to cool the coil;
  a quantity of heat transfer material stationary arranged between the cooling body and the coil; wherein the actuator further includes a mechanical attachment device attaching the coil to the cooling body.

According to another embodiment of the invention, there is provided a lithographic apparatus including an actuator, the actuator including:
  a coil;
  a cooling body to cool the coil;
  a quantity of heat transfer material stationary arranged between the cooling body and the coil; wherein the actuator further includes a mechanical attachment device attaching the coil to the cooling body.

According to a further embodiment of the invention, there is provided a method to construct an actuator, the method including the following steps:
  providing a coil;
  providing a cooling body to cool the coil;
  providing a quantity of heat transfer material between the cooling body and the coil;
  attaching the coil to the cooling body by a mechanical attachment device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
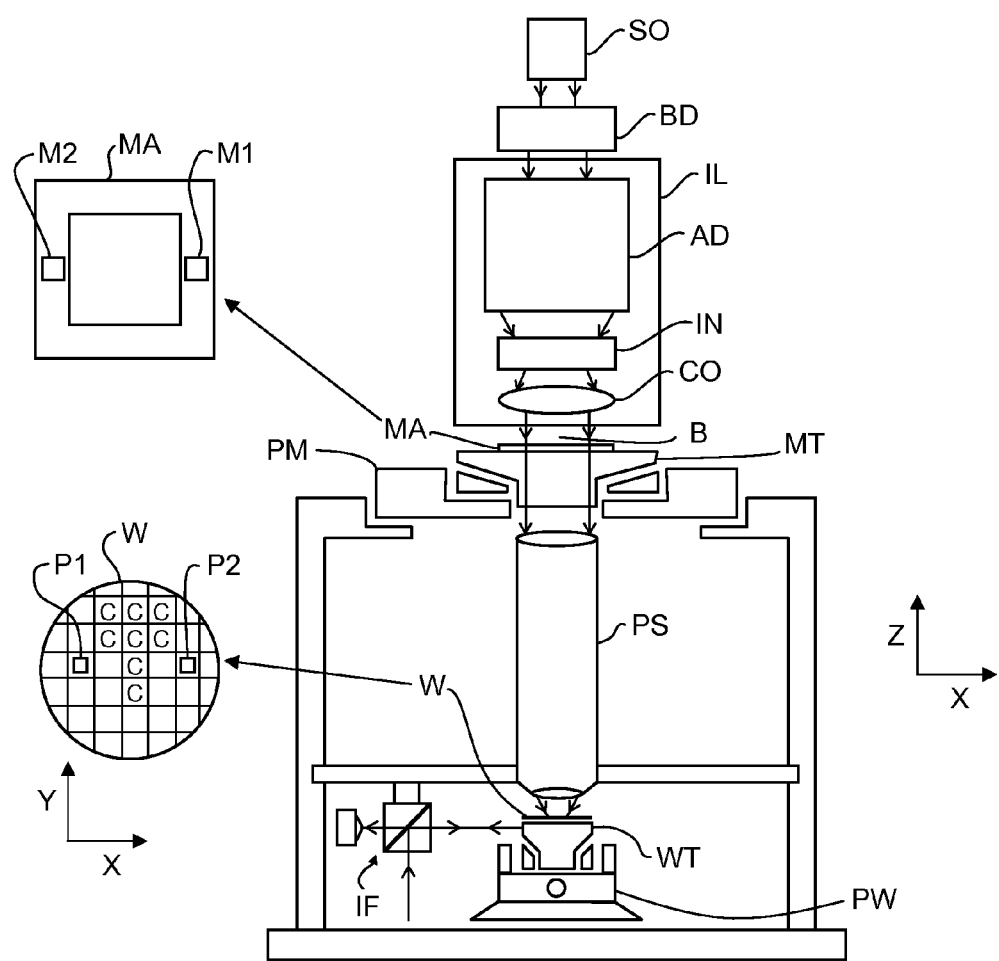
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support (e.g. mask support structure) holds the patterning device in a manner that depends on the orientation of the patterning device, the design of the lithographic apparatus, and other conditions, such as for example whether or not the patterning device is held in a vacuum environment. The patterning device support (e.g. mask support structure) can use mechanical, vacuum, electrostatic or other clamping techniques to hold the patterning device. The patterning device support (e.g. mask support structure) may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Both the short-stroke module and long-stroke module described above as being part of the first and/or second positioning device may include an actuator using the interaction between magnetic fields and a current-carrying conductor, e.g. a coil. However, such types of actuators may also be used in other parts of the lithographic apparatus to apply forces to an object and it is noted that embodiments of the invention may also apply to these actuators. An actuator according to an embodiment of the invention will now be described with reference to FIG. 2 which is particularly suitable to be used in a lithographic apparatus according to FIG. 1, especially in case the actuator is used for generating relatively large forces. It is explicitly noted here that although a planar actuator is shown as an example, embodiments of the invention are not limited to these types of actuators, but may be applied in rotary or linear actuators as well, wherein it is irrelevant whether the actuator has a moving coil or moving magnet configuration.

Figure 2:
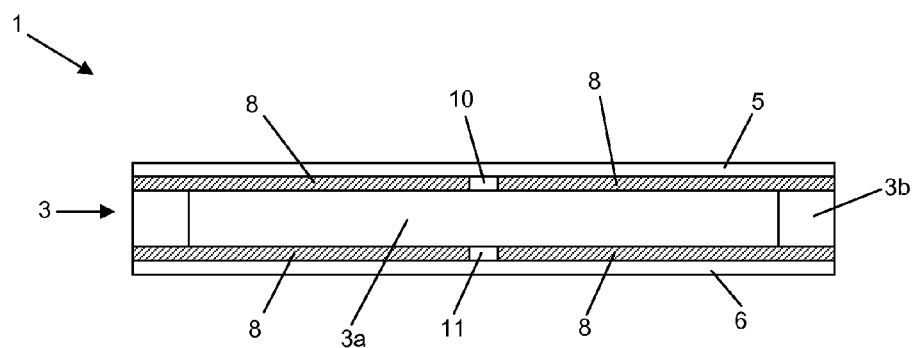
FIG. 2 schematically depicts an actuator according to an embodiment of the invention in cross sectional view.

FIG. 2 schematically depicts an actuator 1 according to an embodiment of the invention in cross sectional view. The actuator 1 includes a coil 3, two cooling bodies 5, 6 arranged at opposite sides of the coil 3 to cool the coil 3, and a quantity of heat transfer material 8 stationary or fixedly arranged between each of the cooling bodies 5, 6 and the coil 3. The actuator 1 further includes two mechanical attachment devices or attachers 10, 11 configured to attach each of the cooling bodies 5, 6 to the coil 3.

The benefit of such an actuator is that the transfer of heat and forces from the coil 3 to the cooling bodies 5, 6 is mainly done by separate elements instead of a single potting material, so that the heat transfer material 8 can be optimized without having to worry about force transfer as this is mainly done by the mechanical attachment devices. Preferably, the mechanical attachment device or attacher provides a larger stiffness between the coil and a respective cooling body than the heat transfer material. More preferably, the heat transfer material hardly transfers forces from the coil to the respective cooling bodies.

Due to the fact that the heat transfer material 8 no longer has to be designed to transfer forces from the coil 3 to the cooling bodies 5, 6, a larger variety of materials is now suitable to be applied as heat transfer material 8, leading to the ability to choose a material with more favorable properties.

The quantity of heat transfer material, which replaces the single potting material with respect to prior art actuators, can for instance be chosen more flexible, thereby reducing the occurring stresses due to thermal expansion differences between the coil 3 and the cooling bodies 5, 6. This means that more heat can be generated before the maximum allowable stress in the heat transfer material is reached, thereby increasing the maximum allowable current through the coil 3, and thus increasing the maximum performance in terms of maximum force.

The larger variety in applicable heat transfer materials may also allow a heat transfer material having an increased cooling efficiency, i.e. higher thermal conductivity, leading to an increase in maximum performance of the actuator as well as the temperature will be lower for the same amount of current. The heat transfer material 8 can for instance be a thermal gel, thermal paste, thermal pad, phase change material or cooling oil without having any significant strength thereby optimizing the heat transfer without limiting the performance.

In FIG. 2, the mechanical attachers 10, 11 are located at the centre of the coil 3, which is also the thermal centre of the coil 3. In the thermal centre, the thermal expansion differences between the coil 3 and the cooling bodies 5, 6 are minimal, so that the stresses in the mechanical attachment devices 10, 11 due to temperature differences are also minimal.

The coil 3 includes a core 3a around which wires or foil, for instance made of copper or aluminum, are wound. The wires or foil are indicated by reference numeral 3b. The mechanical attachers 10, 11 attach the cooling bodies to the core 3a, thereby providing a rigid attachment between the coil 3 and the cooling bodies 5, 6 without the risk of damaging the wires or foil of the coil 3.

Additional mechanical attachers attaching each of the cooling bodies to the coil 3 outside the thermal centre may also be provided. As these mechanical attachment devices are located outside the thermal centre of the coil 3, the mechanical attachment devices preferably have at least one degree of freedom preferably corresponding to a direction in which significant differences in thermal expansion occur.

The mechanical attachment devices or attachers may include adhesives to attach each of the cooling bodies to the coil and/or may include screws or pins or bolts, rivets, clamps. Multiple mechanical devices may be provided each specifically configured for transferring a type of force, e.g. forces in plane of the coil 3, i.e. parallel to the cooling bodies, or forces substantially perpendicular to the plane of the coil 3.

The at least one degree of freedom may be provided by using leaf springs between a cooling body and the coil, for instance in the form of a nest of (leaf)springs attached to a cooling body and encasing the coil, or a rubber-like compound encasing the coil and connected to a cooling body. The latter has the benefit that forces are transferred by means of compression of the rubber-like compound rather than by shear forces.

Figure 3:
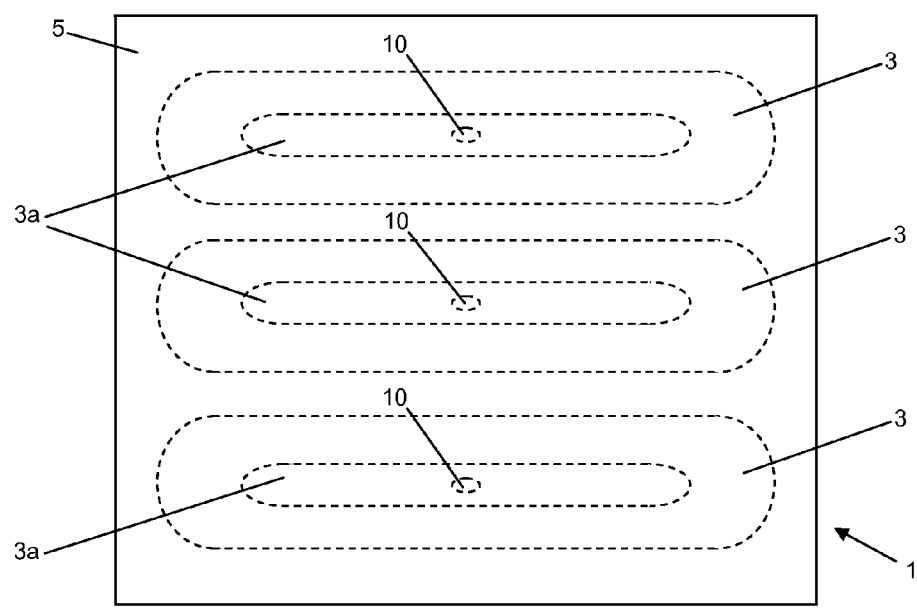
FIG. 3 schematically depicts the actuator of FIG. 2 in top view.

FIG. 3 depicts a top view of the actuator 1 according to FIG. 2. The actuator 1 in this example includes three coils 3 next to each other, each including a core 3a. FIG. 3 further shows mechanical attacher 10 to attach each coil 3 to the cooling body 5. As FIG. 3 shows a top view, the coil 3, core 3a, and mechanical attacher 10 are shown in phantom.

Figure 4:
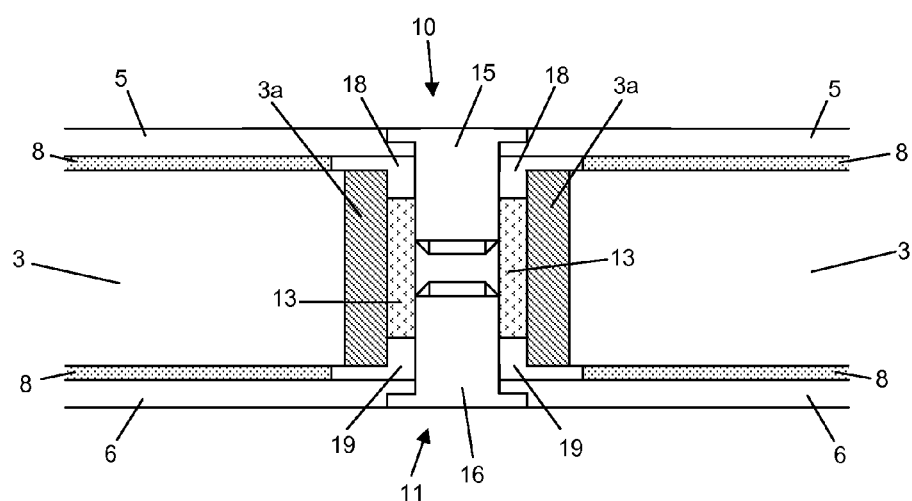
FIG. 4 schematically depicts in detail a mechanical attachment device according to an embodiment of the invention.

FIG. 4 depicts in detail mechanical attachers 10, 11 according to an embodiment of the invention in cross sectional view. Mechanical attachers 10, 11 are configured to attach respective cooling bodies 5, 6 to the core 3a of coil 3.

The mechanical attachers 10, 11 include a threaded bush 13 to receive a screw 15 of mechanical attacher 10 and a screw 16 of mechanical attacher 11. In this embodiment, the mechanical attachers share the same threaded bush 13, however, an embodiment in which each mechanical attacher includes its own threaded bush is also envisaged.

The threaded bush 13 is attached to the core 3a, for instance using glue, welding, soldering or any other kind of suitable attachment means.

The cooling bodies 5, 6 include holes for respectively receiving screws 15, 16, which can be inserted through these holes to mate with the threaded bush and connect the cooling bodies to the coil 3. Between the cooling bodies and the coil 3, spacers 18, 19 are provided to control the distance between coil and cooling body. In this way it can be ensured that a certain desired amount of glue and/or heat transfer material is provided between the cooling body and the coil.

In the above described configuration, the threaded bush is rigidly connected to the core 3a, which makes it particularly suitable at the location of the thermal centre where no thermal expansion differences will occur. When the configuration is also used outside the thermal centre, it is preferred that the mechanical attachment device has at least one degree of freedom to minimize stresses in the coil due to the thermal expansion differences. The one degree of freedom can be realized in the attachment between the threaded bush and the core 3a, for instance by leaf spring connections, an elastomeric connection, or a sliding fit connection to name a few possibilities.

Figure 5:
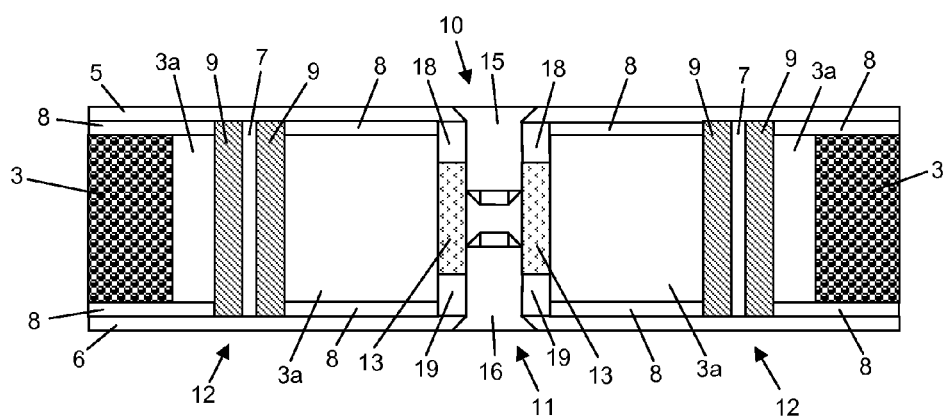
FIG. 5 schematically depicts in detail an actuator according to a further embodiment of the invention.

FIG. 5 schematically depicts an actuator 1 according to a further embodiment of the invention in cross sectional view. The actuator 1 includes a coil 3, two cooling bodies 5, 6 arranged at opposite sides of the coil 3, a quantity of heat transfer material 8 arranged between each of the cooling bodies 5, 6 and the coil 3, and mechanical attachers 10, 11, 12 to attach each of the cooling bodies to the coil 3.

The coil 3 includes a core 3a with three holes for the mechanical attachers. One opening is located in a centre of the core 3a, which is also a thermal centre of the coil 3. The mechanical attachers 10, 11 share a threaded bush 13 attached to the core 3a similar to the mechanical attachment devices according to FIG. 4.

Screws 15, 16 are inserted through openings in the cooling bodies to mate with the threaded bush 13 and attach the cooling bodies to the core of the coil. Spacers 18 and 19 are provided between the coil and the cooling bodies to guarantee a certain desired amount of heat transfer material between the coil and the cooling body.

Two other openings in the core 3a are located outside the thermal centre of the coil. Through the openings, a pin 7 extends from one cooling body to the other and is attached to one of the cooling bodies, preferably both cooling bodies. Between the pin 7 and the core 3a, a resilient material 9, e.g. rubber, is provided to allow thermal expansion differences between the coil and the cooling bodies. When the pin 7 is attached to both cooling bodies mechanical attachers 12 are specifically used to transfer forces in a direction parallel to the plane of the coil, i.e. parallel to a longitudinal direction of the pins 7. The mechanical attachers 12 may include spacers to aid in effectively transferring these forces.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An actuator comprising:
    a coil;
    a cooling body configured to cool the coil;
    a quantity of heat transfer material fixedly arranged between the cooling body and the coil, and
    a mechanical attacher configured to attach the coil to the cooling body,
    wherein the mechanical attacher is configured to attach the coil to the cooling body at the thermal centre of the coil.

2. The actuator of claim 1, wherein the mechanical attacher is configured to provide a larger stiffness between the coil and the cooling body than the quantity of heat transfer material.

3. The actuator of claim 1, wherein the mechanical attacher has at least one degree of freedom configured to allow thermal expansion differences between the cooling body and the coil.

4. The actuator of claim 1, wherein the mechanical attacher comprises a screw, wherein the coil comprises a threaded bore, and wherein the cooling body comprises a hole through which the screw is insertable to mate with the threaded bore thereby attaching the coil to the cooling body.

5. The actuator of claim 1, wherein the coil has a core, and wherein the mechanical attacher is configured to attach the coil to the cooling body by attaching the core to the cooling body.

6. The actuator of claim 1, wherein the mechanical attacher comprises a glue to attach the coil to the cooling body.

7. The actuator of claim 1, wherein multiple cooling bodies are provided, and wherein the coil is sandwiched between two cooling bodies, the coil being attached to both cooling bodies by at least one corresponding mechanical attacher.

8. The actuator of claim 1, wherein multiple coils are provided, and wherein the cooling body is sandwiched between two coils, the cooling body being attached to both coils by a corresponding mechanical attacher.

9. The actuator of claim 1, wherein multiple mechanical attachers are provided to attach the coil to the cooling body.

10. The actuator of claim 1, wherein the mechanical attacher comprises a pin extending from the cooling body into the coil.

11. The actuator of claim 10, wherein two cooling bodies are provided arranged on opposite sides of the coils, and wherein the pin extends all the way from one cooling body to the other cooling body and is attached to both cooling bodies.

12. The actuator of claim 1, wherein the mechanical attacher comprises a spacer between the cooling body and the coil.

13. A lithographic apparatus comprising an actuator according to claim 1.

14. A method to construct an actuator, the method comprising:
    providing a cooling body to cool a coil;
    providing a quantity of heat transfer material between the cooling body and the coil, and
    attaching the coil to the cooling body with a mechanical attacher,
    wherein the mechanical attacher is configured to attach the coil to the cooling body at the thermal centre of the coil.

15. The actuator of claim 1, wherein direct attachment between the coil and the cooling body within a periphery of said coil is solely provided by said mechanical attacher.

* * * * *